United States Patent
Rahman et al.

(10) Patent No.: US 7,847,579 B2
(45) Date of Patent: Dec. 7, 2010

(54) SYSTEMS AND METHODS TO EVALUATE PERMANENT MAGNET MOTORS

(75) Inventors: Khwaja M. Rahman, Troy, MI (US);
Edward L. Kaiser, Orion, MI (US);
Matthew D. Laba, Oakland, MI (US)

(73) Assignee: GM Global Technology Operations, Inc., Detroit, MI (US)

( * ) Notice: Subject to any disclaimer, the term of this patent is extended or adjusted under 35 U.S.C. 154(b) by 350 days.

(21) Appl. No.: 11/769,842

(22) Filed: Jun. 28, 2007

(65) Prior Publication Data
US 2009/0001996 A1    Jan. 1, 2009

(51) Int. Cl.
*G01R 31/34*    (2006.01)
*G01R 23/20*    (2006.01)

(52) U.S. Cl. .................. 324/772; 324/623

(58) Field of Classification Search .......... 324/772, 324/623
See application file for complete search history.

(56) References Cited

U.S. PATENT DOCUMENTS

| | | | |
|---|---|---|---|
| 4,703,243 A * | 10/1987 | Ettelman et al. ........... 318/696 |
| 5,078,008 A * | 1/1992 | Yagi et al. ................ 73/116.05 |
| 7,105,973 B2 * | 9/2006 | Brewster et al. ............ 310/179 |
| 7,275,003 B2 * | 9/2007 | Koh ........................ 702/65 |
| 7,397,216 B2 * | 7/2008 | Schroeder et al. .......... 318/629 |

OTHER PUBLICATIONS

Sheth, N.K. et al. "Effect of Skewing the rotor teeth on the Performance of Doubly Salient Permanent Magnet Motors," Journal of Applied Physics, 2006, vol. 99, No. 8.
Total Harmonic Distortion. Wikipedia, the free encyclopedia. [Retrieved on May 21, 2010]. Retrieved from Internet: <URL: http://en.wikipedia.org/w/index.php?title-Total_harmonic_distortion&oldid=136821595>.
German Office Action dated Jun. 8, 2010, for Application No. 102008029878.

* cited by examiner

*Primary Examiner*—Amy He

(57) ABSTRACT

Methods and systems for evaluating a permanent magnet motor are provided. The method includes the steps of spinning a rotor of the permanent magnet motor; determining a total harmonic distortion of the permanent magnet motor; and comparing the determined total harmonic distortion of the permanent magnet motor with a baseline total harmonic distortion.

12 Claims, 5 Drawing Sheets

SYSTEMS AND METHODS TO EVALUATE PERMANENT MAGNET MOTORS

TECHNICAL FIELD

The present invention generally relates to systems and methods for evaluating permanent magnet motors, and more particularly relates to systems and methods for evaluating permanent magnet motors with improperly assembled permanent magnets.

BACKGROUND OF THE INVENTION

Permanent magnet motors are utilized in applications such as hybrid and electric automobiles. Permanent magnet motors include a rotor having a core that supports permanent magnets and a stator that supports windings in proximity to the permanent magnets of the rotor. The interaction of the permanent magnet supported by the rotor core and the currents in the windings supported by the stator generate a rotary force for driving an automobile, as an example The permanent magnets in the rotors are often skewed to reduce cogging and torque ripple in the permanent magnet motors. Skewing is the process by which the magnets in the rotor can be either placed an axial angle relative to one another or rotated in steps. The former process is called a continuous skew since the rotor magnet angle is continuously varied along the rotor length by placing the magnet in an angle. In the latter process, called the step skew, the machine rotor core is formed in portion along the machine axial length and the magnet of each portion is slightly rotated with respect to the magnet of the previous segment. Skewing reduces harmonics in the air-gap flux, and as a result, reduces the cogging and torque ripple. Cogging is the torque or force pulsation produced by the interaction of the rotating magnets with the stator teeth. Generally, torque ripple is a similar phenomenon to cogging, but affects the winding current. Skewing makes rotor manufacturing more complicated because the skewed magnets are more difficult to properly position and align. Evaluation of the permanent magnet motors and identification of incorrectly assembled rotors can be important, particularly at an end-of-line manufacturing test. Typically, the evaluation includes measuring the back electromotive force (EMF) generated in the windings of the stator by the rotating magnets of the rotor. However, the back EMF of an incorrectly assembled rotor may not vary sufficiently from that of a properly assembled rotor to signify an incorrect assembly of magnets.

Accordingly, it is desirable to provide improved methods for evaluating permanent magnet motors. In addition, it is desirable to provide improved systems for evaluating permanent magnet motors. Furthermore, other desirable features and characteristics of the present invention will become apparent from the subsequent detailed description and the appended claims, taken in conjunction with the accompanying drawings and the foregoing technical field and background.

SUMMARY OF THE INVENTION

A method for evaluating a permanent magnet motor is provided in accordance with an exemplary embodiment of the present invention. The method includes the steps of spinning a rotor of the permanent magnet motor; determining a total harmonic distortion of the permanent magnet motor; and comparing the determined total harmonic distortion of the permanent magnet motor with a baseline total harmonic distortion.

A method for evaluating a permanent magnet motor is provided in accordance with another exemplary embodiment of the present invention. The method includes spinning a rotor of the permanent magnet motor; and determining a total harmonic distortion (THD) of the permanent magnet motor.

A system for evaluating a permanent magnet motor is provided in accordance with yet another exemplary embodiment of the present invention. The system includes an input machine configured to spin a rotor of the permanent magnet motor; and an analyzer configured to determine a total harmonic distortion of the permanent magnet motor.

DESCRIPTION OF THE DRAWINGS

The present invention will hereinafter be described in conjunction with the following drawing figures, wherein like numerals denote like elements, and wherein.

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
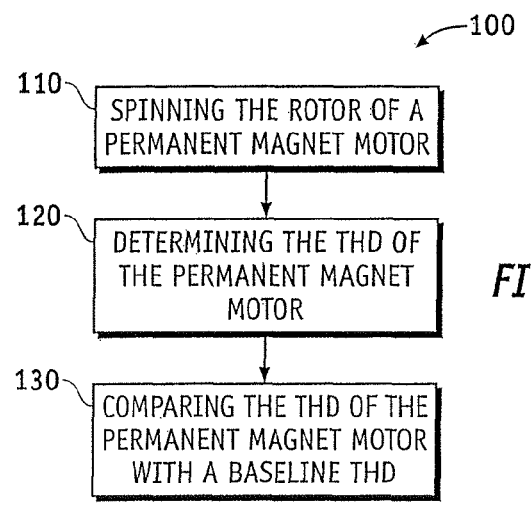
FIG. 1 is a flow chart illustrating a method for evaluating a permanent magnet motor in accordance with an exemplary embodiment of the present invention.

Referring to FIG. 1, an exemplary embodiment of a method 100 for evaluating a permanent magnet motor is provided, and will additionally be described with the system 8 of FIG.

2. In various embodiments, the motor 10 can be evaluated as part of an end-of-line transmission or motor test at a manufacturer or OEM facility.

In accordance with an exemplary embodiment of the present invention, the method 100 begins with spinning a rotor 20 (FIG. 3) of the motor 10 with an input machine 12 (step 110). The input machine 12 can be, for example, a dynamometer machine. The motor 10 may form parts of various automobile components such as, for example, a traction system of a fuel cell vehicle or motor for a hybrid or an electric vehicle. The motor 10 may also be used in high temperature applications unrelated to motor vehicles. The motor 10 can include both embedded and surface-mounted permanent magnet machines, of either the concentrated or distributed winding machine.

Figure 3:
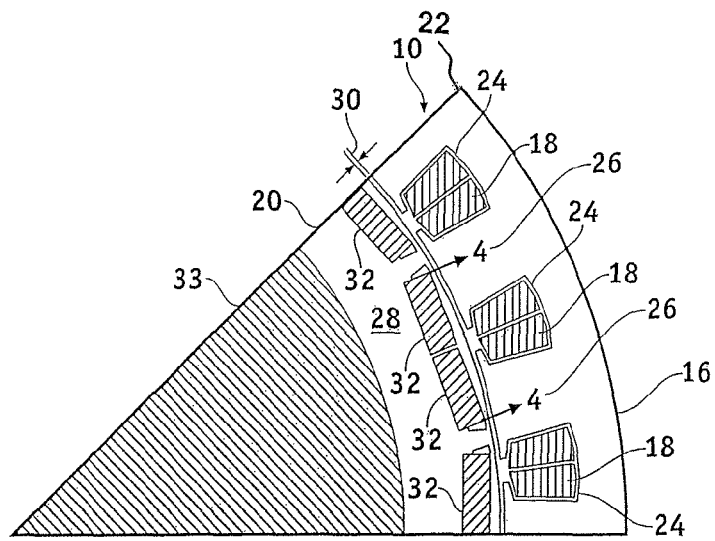
FIG. 3 is a partial cross-sectional view of the permanent magnet motor for evaluation in the system of FIG. 2.

FIG. 3 is a cross-sectional view of a portion of the motor 10. The motor 10 includes a stator 16 and the rotor 20 rotatably disposed within the stator 16. The stator 16 includes a stator core 22 that is formed by stacking a plurality of magnetic steel sheets that, when stacked, together form the shape of a cylinder having a hollow core. A plurality of slots 24 are formed in the stator core 22 and are arranged in a circumferential arrangement. The stator core 22 also includes a plurality of stator teeth 26 that are disposed between the slots 24. Windings 18 (or "coils") are wound through the slots 24 and around the stator teeth 26. Embodiments of the present invention are applicable to any phase, pole, and slot configuration of the motor 10.

The rotor 20 includes a rotor core 28 that is formed by stacking a plurality of magnetic steel sheets that, when stacked, together form the shape of a cylinder. The rotor core 28 is disposed in the stator core 22 hollow core, while being spaced a predetermined distance from the stator core 22 so that a gap 30 is formed between the stator core 22 and the rotor core 28. A plurality of insertion holes are formed in the rotor core 28 and are arranged in a circumferential arrangement to support a plurality of permanent magnets 32 that are inserted therein. In an alternate embodiment, the permanent magnets 32 can be mounted on the outer surface of the rotor 20. Generally, the permanent magnets 32 are skewed, as discussed in further detail below, and inserted into the rotor 20 by hand. Exemplary permanent magnets 32 are rare earth magnets such as neodymium iron boron or samarium cobalt magnets, although ceramic and alnico magnets may be used for other embodiments according to design requirements. A rotary shaft 33 is inserted in a hollow region formed at the center of the rotor 20, and rotates together with the rotor 20.

When the rotor 20 moves via the rotary shaft 33 with respect to the stator 16, the permanent magnets 32 are moved past the windings 18 and voltage is thus induced in the windings 18 through electromagnetic induction. Conversely, if current is supplied to the windings 18 by, for example, a battery (not shown), a magnetic field is consequently generated at the stator 16, which interacts with the permanent magnets 32 in the rotor 20 such that the rotor 20 and the attached rotary shaft 33 rotate to generate a rotary driving force.

Figure 4:
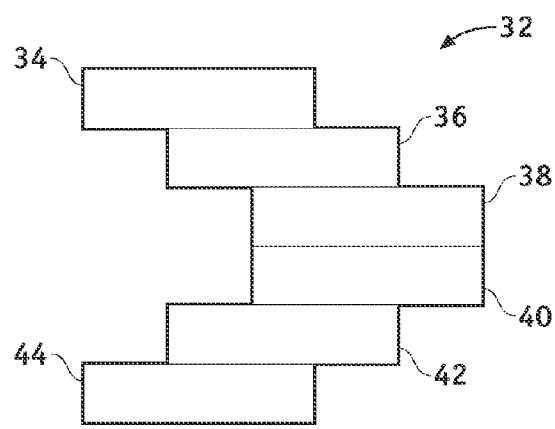
FIG. 4 is a side view of a properly assembled permanent magnet suitable for use in the permanent magnet motor of FIG. 3 as viewed through plane 4-4 of FIG. 3.

FIG. 4 is a side view of a permanent magnet 32 suitable for use in the permanent magnet motor of FIG. 3 as viewed through plane 4-4 of FIG. 3. The permanent magnet 32 includes six skewed magnet portions 34, 36, 38, 40, 42, and 44. The rotor portions 34, 36, 38, 40, 42, and 44 are rotated or "offset" as shown in FIG. 4 with respect to one another by a predetermined angle to form the given skew pattern. The angle of rotation of each rotor portion 34, 36, 38, 40, 42, or 44 with respect to the other depends on the torque ripple and cogging frequency. Although six magnet portions 34, 36, 38, 40, 42, and 44 are illustrated, a greater or fewer number of magnet portions may be provided. The permanent magnet 32 illustrated in FIG. 4 is one example of a skew pattern formed the properly assembled magnet portions 34, 36, 38, 40, 42, and 44. In this illustrated embodiment, the magnet portions 34, 36, 38, 40, 42, and 44 form a three step skew pattern with a first magnet portion 34, a second magnet portion 36 offset from the first magnet portion 34, third and fourth magnet portions 38 and 40 offset from both the first and second magnet portions 34 and 36, a fifth magnet portion 42 even with the second magnet portion 36, and a sixth magnet portion 44 even with the first magnet portion 34. Generally, the skew pattern of the magnet portions 34, 36, 38, 40, 42, and 44 attempts to minimize a major ripple frequency (the fundamental) and the second harmonic that arises from the rotor and stator slotting effect. The slotting effect is the interaction of the stator slot 24 and the rotor 20 as produced by the magnet 32. The slotting effect may be a source of the cogging and the ripple torque, and the cogging and the torque ripple resulting from the slotting effect may be a source of noise in an electric machine. Other skew patterns can be provided based on the particular motor design, cost, and desired results, and the illustrated arrangement of the magnet portions 34, 36, 38, 40, 42 and 44 is just one example of an optimized skew pattern.

Figure 5:
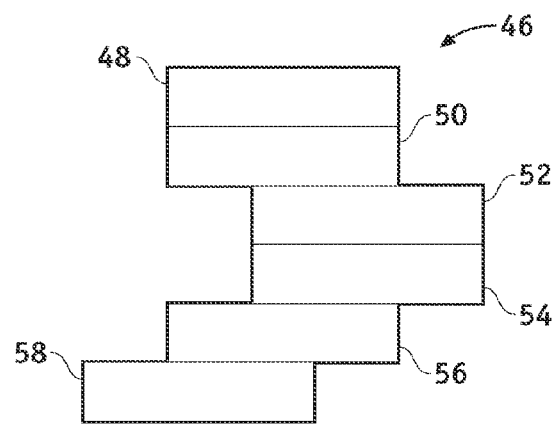
FIG. 5 is a side view of an improperly assembled permanent magnet utilized in a motor such as the permanent magnet motor of FIG. 3 as viewed through plane 4-4 of FIG. 3.

FIG. 5 is a side view of an improperly assembled permanent magnet 46, relative to the optimized, properly assembled permanent magnet 32, that may be present in a motor to be evaluated, such as the motor 10 of FIG. 3. The permanent magnet 46 includes six skewed magnet portions 48, 50, 52, 54, 56, and 58. As illustrated, the permanent magnet 46 includes a first magnet portion 48, a second magnet portion 50 even with the first magnet portion 48, third and fourth magnet portions 52 and 54 even with each other and offset with respect to first and second magnet portions 48 and 50, a fifth magnet portion 56 offset with respect to the third and fourth magnet portions 52 and 54 and even with the first and second magnet portions 48 and 50, and a sixth magnet portion 58 offset with respect to the other magnet portions 48, 50, 52, 54, and 56. As compared to the properly assembled permanent magnet 32 shown in FIG. 4, it is evident that the first magnet portion 48 of the permanent magnet 46 is in an incorrect position. Specifically, the first magnet portion 48 should be offset with respect to the second and fifth magnet portions 50 and 56 and even with respect to the sixth magnet portion 58. The first magnet portion 48 could have been misaligned, for example, as a result of a manufacturing error.

Figure 2:
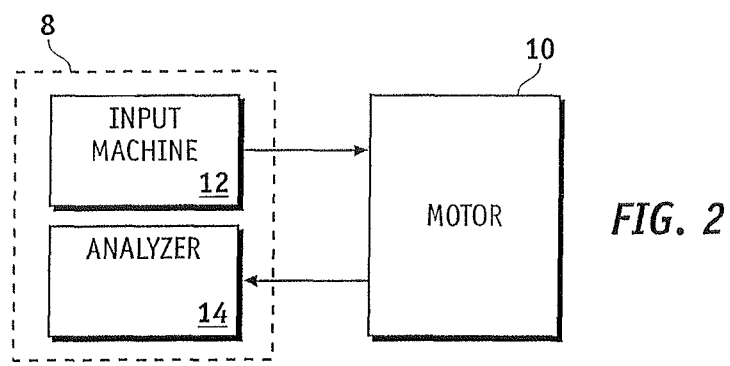
FIG. 2 is a block diagram of a system for evaluating a permanent magnet motor in accordance with an exemplary embodiment of the present invention.
Figure 6:
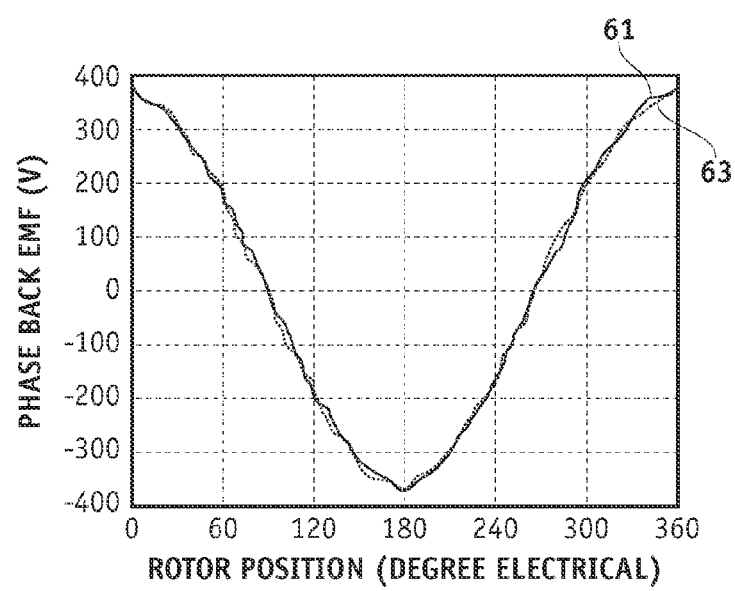
FIG. 6 is a graph illustrating the back electromotive force (EMF) of a permanent magnet motor with the improperly assembled permanent magnet of FIG. 5 compared to the back EMF of a permanent magnet motor with the properly assembled permanent magnet of FIG. 4.

In conventional systems and methods for evaluating the permanent magnets of permanent magnet motors, the back electromagnetic force of the permanent magnet motor is measured. Back EMF is defined as the amount of energy gained per unit charge that passes through a device in the opposite direction to the electric field existing across that device, and is measured in volts. Back EMF can be measured, for example by a power analyzer 14 coupled to the motor 10, as shown in FIG. 2. FIG. 6 is a graph simulating the back EMF 61 of a permanent magnet motor with one improperly assembled magnet, such as the improperly assembled permanent magnet 46 of FIG. 5, compared to the back EMF 63 of a permanent magnet motor with properly assembled magnets, such as the properly assembled permanent magnet 32 of FIG. 4 as the rotor of the motor completes a full electrical cycle.

As can be seen from the graph in FIG. 6, the back EMF 61 of a rotor with one improperly assembled permanent magnet is relatively close to the back EMF 63 of a rotor with properly assembled magnets. For example, the back EMFs 61 and 63 of a properly assembled rotor with the permanent magnet 32 of FIG. 4 and the improperly assembled rotor with the permanent magnet 46 of FIG. 5 are only different by 1.5%, which is typically within the acceptable tolerances of manufacturer and suppliers. Acceptable tolerances of back EMF can be, for example, 5%. As such, if only the back EMF is considered, the motor with improperly assembled permanent magnets 46 may not be detected.

Referring back to FIGS. 1, 2, and 3, in accordance with the exemplary method 100, the total harmonic distortion (THD) of a permanent magnet motor is measured to evaluate the arrangement of permanent magnets (step 120). THD is a measurement of the harmonic distortion present and is defined as the ratio of the sum of the powers of all harmonic components to the power of the fundamental, and is expressed in percent as a distortion factor. THD can be represented by the following equation.

$$THD = \frac{\sqrt{V_2^2 + V_3^2 + V_4^2 + \cdots + V_n^2}}{V_1}$$

where $V_n$ refers to the voltage of harmonic n.

THD can be measured "directly," that is, THD can be measured directly by attaching the power analyzer 14 to the windings 18 of the stator 16 (FIG. 3). In an alternative embodiment, THD can be calculated from the back EMF measurement.

Figure 7:
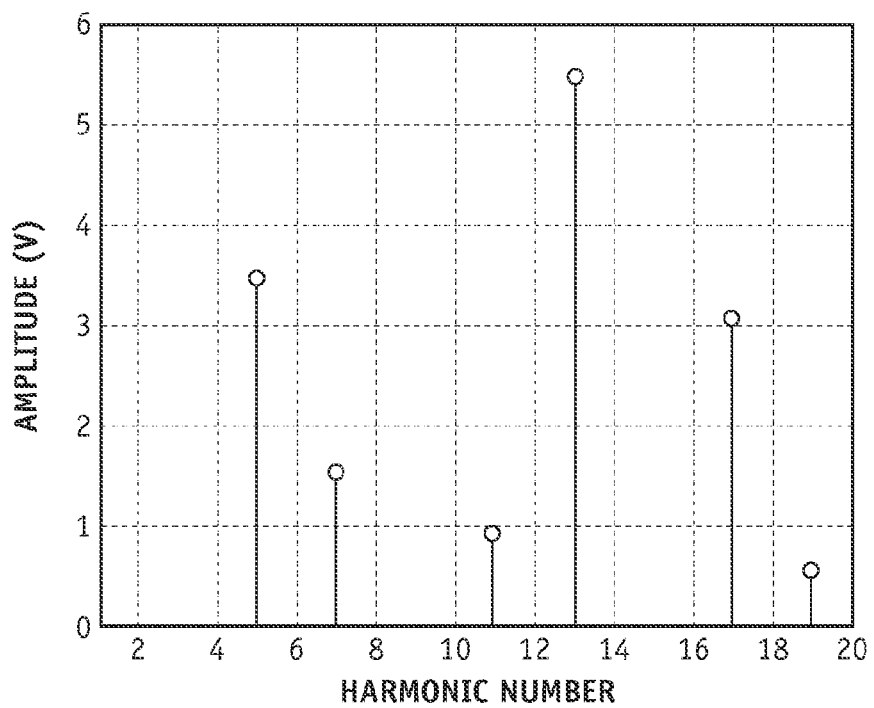
FIG. 7 is a graph representing the harmonics and corresponding voltages of a permanent magnet motor with the improperly assembled permanent magnet of FIG. 5.

FIG. 7 is an exemplary graph representing the harmonics and the corresponding voltages of each harmonic for a motor assembled with at least one improperly assembled permanent magnet, such as the permanent magnet 46 of FIG. 5. In one exemplary embodiment, THD can be measured on the motor 10 by the power analyzer 14 of FIG. 2 as the motor 10 is being spun by the input machine 12. From the values of FIG. 7, the THD for the motor assembled with the improperly assembled permanent magnet 46 was determined to be 2.04%.

Figure 8:
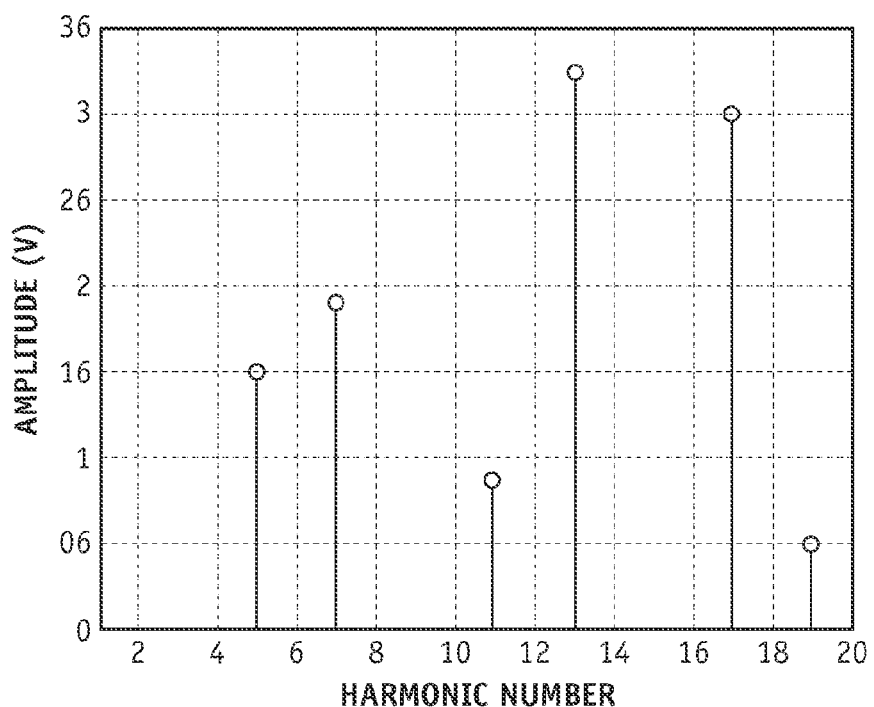
FIG. 8 is a graph representing the harmonics and corresponding voltages of a permanent magnet motor with the properly assembled permanent magnets such as the permanent magnet of FIG. 4.

Conversely, FIG. 8 is an exemplary graph representing the harmonics and the corresponding voltages of each harmonic for a rotor assembled with properly assembled magnets, such as the properly assembled permanent magnet 32 of FIG. 4. From the values of FIG. 8, the THD is calculated to be 1.4%. Since the permanent magnet 32 of FIG. 4 is a properly assembled magnet, the THD illustrated by FIG. 8 can be considered a baseline THD for this assembly and can provide a comparison THD for the other motors of the type to be evaluated.

In accordance with the exemplary method 100, the THD of the permanent magnet motor to be evaluated, e.g., the permanent magnet motor with magnets 46 of FIG. 5, is compared to the baseline THD of a properly assembled permanent magnet motor, e.g., the permanent magnet motor with magnets 32 of FIG. 4 (step 130). In this example, the baseline THD of a properly assembled rotor with the permanent magnets 32 of FIG. 4 and the THD of a rotor with at least one improperly assembled permanent magnet 46 is different by 46%, which is a relatively large difference. Accordingly, compared to a back EMF comparison, THD provides a more pronounced indicator of an incorrectly assembled rotor, and particularly, a more pronounced indicator of one or more magnets with one or more misaligned magnet portions. Generally, in one exemplary embodiment, if the measured THD differs from the baseline THD of a motor by less than 10%, the motor is evaluated as being properly assembled. In another embodiment, if the measured THD differs from the baseline THD by less than 5%, the motor is evaluated as being properly assembled.

Figure 9:
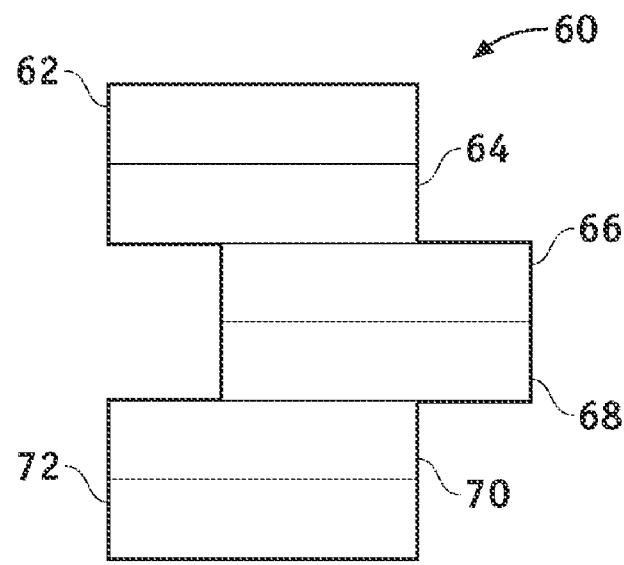
FIG. 9 is a side view of improperly assembled permanent magnet utilized in a motor such as the permanent magnet motor of FIG. 3 as viewed through line 4-4 of FIG. 3.

FIG. 9 is a side view of another improperly assembled permanent magnet 60, relative to the optimized, properly assembled permanent magnet 32, that may be present in a rotor of a motor to be evaluated in accordance with an exemplary embodiment of the present invention. The permanent magnet 60 includes six skewed magnet portions 62, 64, 66, 68, 70, and 72. The permanent magnet 60 includes a first magnet portion 62, a second magnet portion 64 even with the first magnet portion 62, third and fourth magnet portions 66 and 68 even with each other and offset with respect to first and second magnet portions 62 and 64, a fifth magnet portion 70 offset with respect to the third and fourth magnet portions 66 and 68 and even with the first and second magnet portions 62 and 64, and a sixth magnet portion 72 offset with respect to the third and fourth magnet portions 66 and 68 and even with respect to the first, second, and fifth magnet portions 62, 64, and 70. As compared to the properly assembled permanent magnet 32 shown in FIG. 4, the first and sixth magnet portions 62 and 72 are in incorrect positions. Specifically, the first and sixth magnet portions 62 and 72 should be offset relative to the second and fifth magnet portions 64 and 70.

Figure 10:
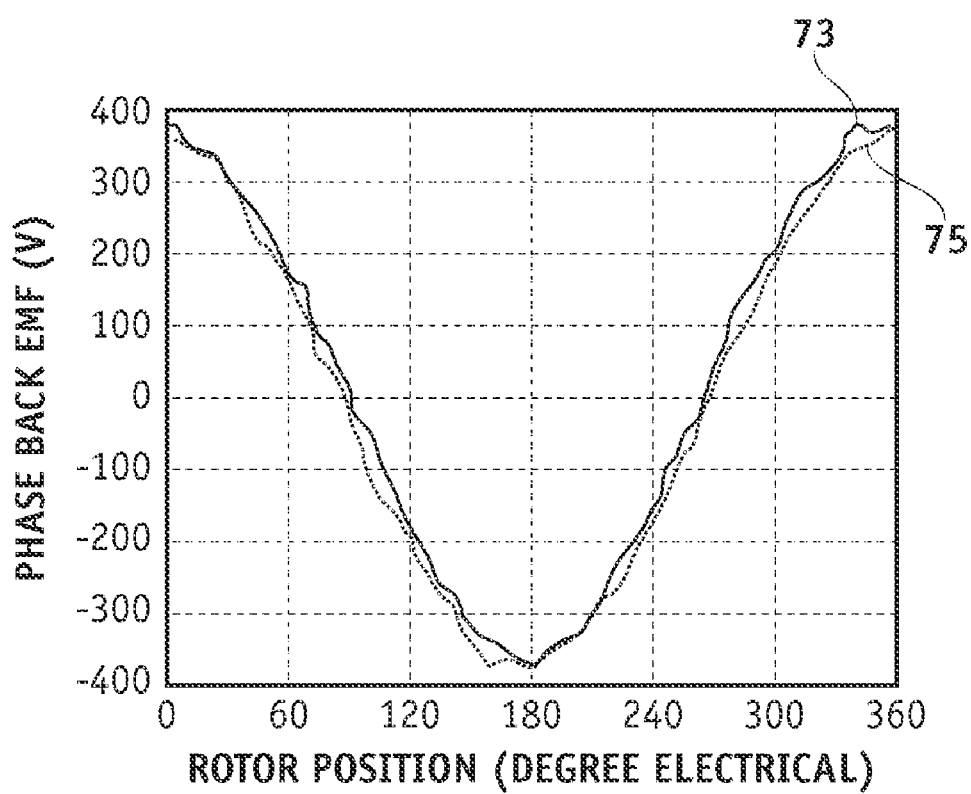
FIG. 10 is a graph illustrating the back EMF of a permanent magnet motor with the improperly assembled permanent magnet of FIG. 9 compared to the back EMF of a permanent magnet motor with the properly assembled permanent magnet of FIG. 4.

FIG. 10 is a graph simulating the back EMF 73 of a permanent magnet motor with an improperly assembled permanent magnet, such as the permanent magnet 60 of FIG. 9, compared to the back EMF 75 of a permanent magnet motor with properly assembled magnets, such as the properly assembled permanent magnet 32 of FIG. 4. In this case, the improperly assembled magnet has two misaligned portions. However, the back EMF 73 of the permanent magnet motor with an improperly assembled permanent magnet is only different from a permanent magnet motor with properly assembled permanent magnets by 2.7%, which, again, may be an insufficient indicator of a misassembled motor.

Figure 11:
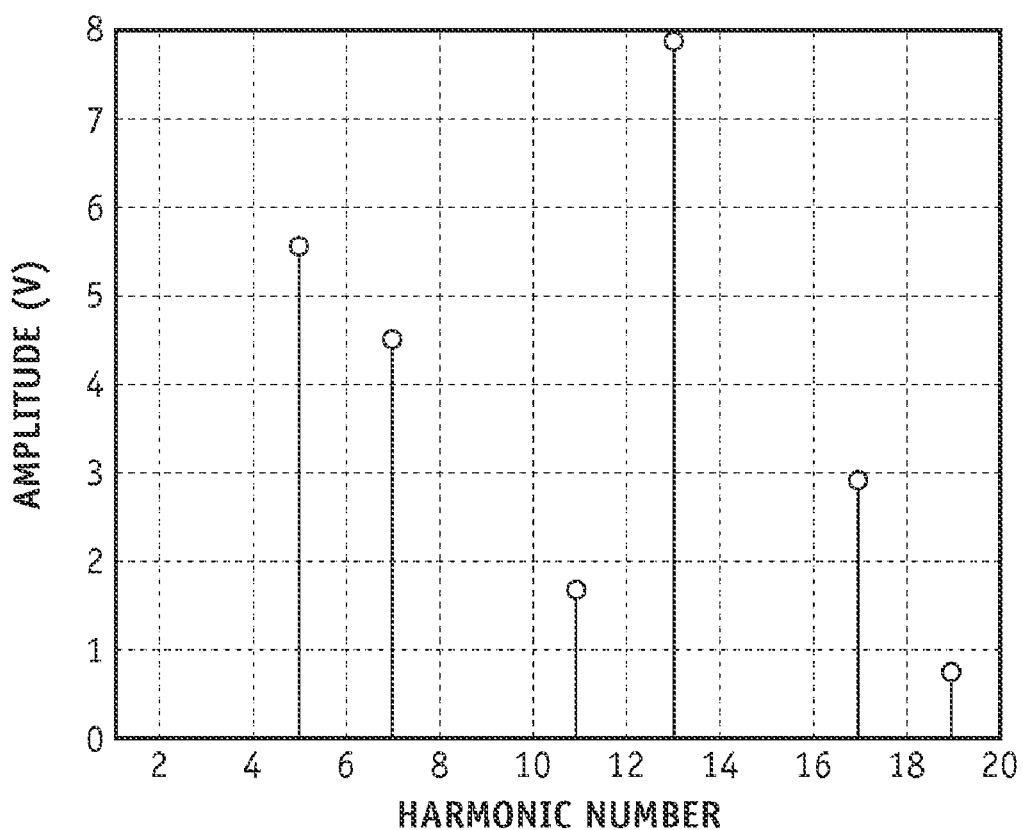
FIG. 11 is a graph representing the harmonics and corresponding voltages of a permanent magnet motor with with the improperly assembled permanent magnet of FIG. 9.

FIG. 11 is a graph representing the THD of a motor assembled with an improperly assembled permanent magnet, such as the permanent magnet 60 of FIG. 9. The THD for the motor assembled with the improperly assembled permanent magnet 60 was determined to be 3.2%. As such, the THDs of a rotor with the properly assembled permanent magnet 32 of FIG. 4 and the rotor with the improperly assembled permanent magnet 60 of FIG. 9 differ by 230%, which indicates that the motor has been misassembled. Generally, the greater the measured THD differs from the baseline THD, the greater the number of magnet portions that are misaligned.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for evaluating a permanent magnet motor, wherein the rotor is rototably mounted in proximity to a stator with windings such that the rotating rotor induces a voltage in the windings of the stator, the method comprising the steps of:

spinning a rotor of the permanent magnet motor at an end-of-line motor test or an end-of-line transmission manufacturing test;

determining a total harmonic distortion of the permanent magnet motor at the windings, wherein the determining step includes calculating the total harmonic distortion (THD) from the equation $$THD = \frac{\sqrt{V_2^2 + V_3^2 + V_4^2 + \cdots + V_n^2}}{V_1}$$

where $V_n$ refers to the voltage of harmonic n; and comparing the determined total harmonic distortion of the permanent magnet motor with a baseline total harmonic distortion.

2. The method of claim 1, wherein the determining step includes directly measuring the total harmonic distortion of the permanent magnet motor.

3. The method of claim 1, wherein the spinning step includes spinning the rotor of the permanent magnet motor at the end-of-line motor test.

4. The method of claim 1, wherein the spinning step includes spinning the rotor of the permanent magnet motor at the end-of-line transmission manufacturing test.

5. The method of claim 1, wherein the comparing step indicates that the rotor is improperly assembled if the determined total harmonic distortion is different from the baseline total harmonic distortion by more than 10%.

6. The method of claim 1, wherein the comparing step indicates that the rotor is improperly assembled if the determined total harmonic distortion is different from the baseline total harmonic distortion by more than 5%.

7. The method of claim 1, wherein the rotor includes a plurality of permanent magnets, and wherein each of permanent magnets includes a plurality of skewed magnet portions, and wherein the comparing step comprises indicating when at least one of the plurality of skewed magnet portions is misaligned.

8. A method for evaluating a permanent magnet motor having a rotor with a plurality of permanent magnets, each of the permanent magnets including a plurality of skewed magnet portions, the method comprising the steps of:

spinning the rotor of the permanent magnet motor;

determining a total harmonic distortion (THD) of the permanent magnet motor, wherein the determining step includes calculating the total harmonic distortion (THD) from the equation $$THD = \frac{\sqrt{V_2^2 + V_3^2 + V_4^2 + \cdots + V_n^2}}{V_1}$$

where $V_n$ refers to the voltage of harmonic n;

comparing the determined total harmonic distortion (THD) of the permanent magnet motor with a baseline total harmonic distortion; and indicating when at least one of the plurality of skewed magnet portions is misaligned.

9. The method of claim 8, wherein the spinning step includes spinning the rotor of the permanent magnet motor at an end-of-line transmission manufacturing test.

10. The method of claim 8, wherein the indicating step includes determining that at least one of the plurality of skewed magnet portions is misaligned if the determined total harmonic distortion (THD) is different from the baseline total harmonic distortion by more than 10%.

11. The method of claim 8, wherein the indicating step includes determining that at least one of the plurality of skewed magnet portions is misaligned if the determined total harmonic distortion (THD) is different from the baseline total harmonic distortion by more than 5%.

12. The method of claim 8, wherein the determining step includes directly measuring the total harmonic distortion (THD).

* * * * *